US010798835B2

(12) United States Patent
Takeda et al.

(10) Patent No.: US 10,798,835 B2
(45) Date of Patent: Oct. 6, 2020

(54) ELECTRONIC APPARATUS

(71) Applicant: DENSO TEN Limited, Kobe-shi, Hyogo (JP)

(72) Inventors: Yasuaki Takeda, Kobe (JP); Teruo Takenaka, Kobe (JP)

(73) Assignee: DENSO TEN Limited, Kobe-shi (JP)

( * ) Notice: Subject to any disclaimer, the term of this patent is extended or adjusted under 35 U.S.C. 154(b) by 0 days.

(21) Appl. No.: 16/537,010

(22) Filed: Aug. 9, 2019

(65) Prior Publication Data

US 2020/0178407 A1    Jun. 4, 2020

(30) Foreign Application Priority Data

Nov. 30, 2018    (JP) .................................. 2018-225973

(51) Int. Cl.
    *H05K 5/00*      (2006.01)
    *H05K 5/02*      (2006.01)

(52) U.S. Cl.
    CPC .......... *H05K 5/0069* (2013.01); *H05K 5/0217* (2013.01)

(58) Field of Classification Search
    CPC .. H05K 5/0069; H05K 5/0217; H05K 5/0043; H05K 5/0026; H05K 5/0039; H01R 13/52; H01R 13/5213; H01R 12/716
    USPC ........................................................ 361/752
    See application file for complete search history.

(56) References Cited

U.S. PATENT DOCUMENTS

| | | | | |
|---|---|---|---|---|
| 7,080,990 | B1* | 7/2006 | Juntwait | H01R 12/724 439/79 |
| 9,653,853 | B2* | 5/2017 | Ohtani | H01R 13/665 |
| 2003/0119349 | A1* | 6/2003 | Bakker | H01R 13/4538 439/140 |
| 2005/0105253 | A1* | 5/2005 | Sakai | H05K 5/0039 361/752 |
| 2012/0295469 | A1* | 11/2012 | Takeda | H01R 12/724 439/377 |
| 2015/0132977 | A1* | 5/2015 | Kanou | H05K 5/0069 439/78 |
| 2017/0257959 | A1* | 9/2017 | Ogitani | H01R 12/716 |
| 2019/0297737 | A1* | 9/2019 | Kawamura | B60R 16/0239 |
| 2019/0334276 | A1* | 10/2019 | Ichikawa | H05K 5/0069 |
| 2019/0380215 | A1* | 12/2019 | Tsujiya | H05K 5/0052 |
| 2020/0076136 | A1* | 3/2020 | Kuratani | H01R 13/502 |

FOREIGN PATENT DOCUMENTS

| | | |
|---|---|---|
| JP | 2013-206969 A | 10/2013 |
| JP | 2014-79038 A | 5/2014 |
| JP | 2018-125459 A | 8/2018 |

* cited by examiner

*Primary Examiner* — Daniel P Wicklund
*Assistant Examiner* — Sagar Shrestha
(74) *Attorney, Agent, or Firm* — Oliff PLC

(57) ABSTRACT

An electronic apparatus includes: a connector that has a protrusion on an outer surface; a case that has an opening and houses the connector; a lid for the opening that is attached to the case such that at least part of the connector is seen from an outside of the case, the lid including a gap through which the protrusion of the connector passes when the lid is attached to the case; and a filler that fills the gap of the lid in a state in which the lid is attached to the case.

7 Claims, 9 Drawing Sheets

ELECTRONIC APPARATUS

BACKGROUND OF THE INVENTION

Field of the Invention

The invention relates to an electronic apparatus.

Description of the Background Art

Conventionally, an electronic apparatus that includes a circuit board and a case, has been known. The circuit board includes various electronic parts, such as a connector, and the case houses the connector and the circuit board. In a case of the electronic apparatus of the conventional technology, the connector and the circuit board are inserted into the electronic apparatus from an opening thereof and then a lid is attached to the opening. The lid is attached to the opening of the case, having part of the connector seen from an outside of the case.

There is a case in which a protrusion is formed on an outer circumferential surface of the connector. For example, such a protrusion is formed as part of a lever mechanism for easy engagement of the connector with a counterpart connector or for another purpose.

In a case where the protrusion is formed on the outer circumferential surface of the connector, a gap through which the protrusion passes is formed on the lid to prevent the protrusion on the connector from contacting the lid when the lid is attached on the opening of the case.

However, in a case of the lid having the gap, a foreign object, such as a dust, enters the case more easily from the gap in the lid. Thus, there is a possibility that the foreign object is attached to the circuit board or the like, and may cause a problem of the electronic apparatus.

SUMMARY OF THE INVENTION

According to one aspect of the invention, an electronic apparatus includes: a connector that has a protrusion on an outer surface; a case that has an opening and houses the connector; a lid for the opening that is attached to the case such that at least part of the connector is seen from an outside of the case, the lid including a gap through which the protrusion of the connector passes when the lid is attached to the case; and a filler that fills the gap of the lid in a state in which the lid is attached to the case.

Thus, it is possible to prevent a foreign object from entering an inside of the case from the gap of the lid.

Therefore, an object of the invention is to prevent a foreign object from entering an inside of a case from a gap of a lid.

These and other objects, features, aspects and advantages of the invention will become more apparent from the following detailed description of the invention when taken in conjunction with the accompanying drawings.

DESCRIPTION OF THE EMBODIMENTS

Embodiments of an electronic apparatus of the invention will be described in detail with reference to the drawings. The invention is not limited by the embodiments below.

First Embodiment

Figure 1:
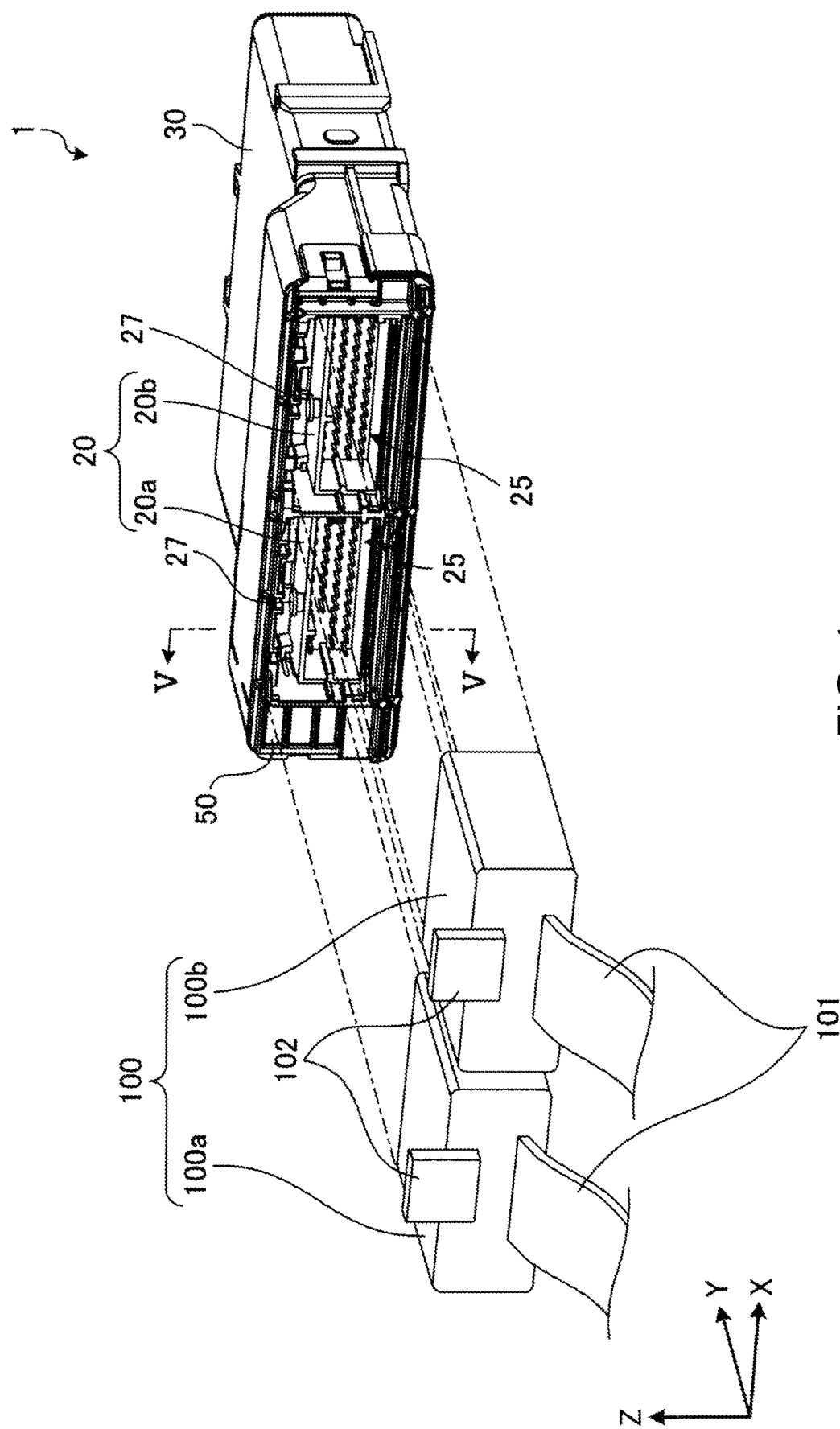
FIG. 1 is a perspective view illustrating a configuration example of an electronic apparatus in a first embodiment.

FIG. 1 is a perspective view illustrating a configuration example of an electronic apparatus in a first embodiment. A three-dimensional Cartesian coordinate defined by an X-axis, a Y-axis, and a Z-axis, which are orthogonal to one another, is illustrated in FIG. 1 for easy explanation. The Cartesian coordinate may be illustrated in another drawing that will be used for explanation.

Moreover, for easy explanation, a positive Z-axis side may be recited as "upper side" in the description below, a negative Z-axis side may be recited as "lower side," a positive X-axis side may be recited as "right side," a negative X-axis side may be recited as "left side," a positive Y-axis side may be recited as "back side," and a negative Y-axis side may be recited as "front side." Expressions that show the directions, such as upper, lower, right, and left, do not limit a side, an orientation, etc. of the electronic apparatus when the electronic apparatus is installed. Moreover, FIG. 1 and subsequent drawings thereof are pattern diagrams.

As shown in FIG. 1, an electronic apparatus 1 of this embodiment houses a circuit board 10 (see FIG. 2), a connector 20, etc. The electronic apparatus 1 is configured, for example, to be installed on a vehicle, not illustrated, and to be connectable to a counterpart connector 100. The electronic apparatus 1 is described to be installed in the vehicle. However, the electronic apparatus 1 does not have to be installed in the vehicle. Moreover, connection between the electronic apparatus 1 and the counterpart connector 100 will be described later.

Figure 2:
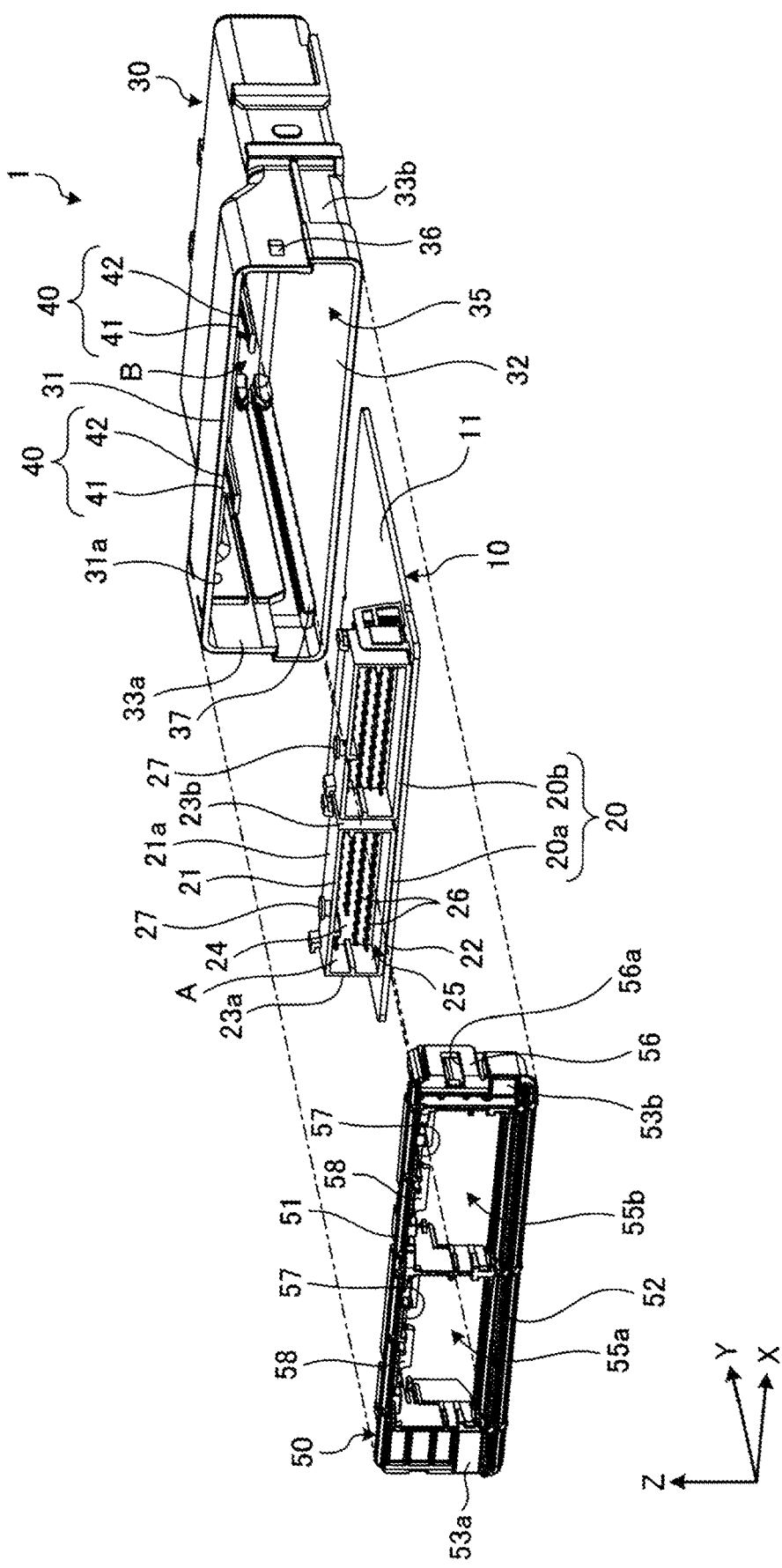
FIG. 2 is a perspective view of the electronic apparatus.

FIG. 2 is an exploded perspective view of the electronic apparatus 1. As shown in FIG. 2, the electronic apparatus 1 includes the circuit board 10, the connector 20, a case 30, and a lid 50.

The circuit board 10 is an electronic circuit board on which various electronic parts, such as the connector 20, are mounted, for example, on a main surface 11. The circuit board 10 is made from, for example, resin. However, a material of the circuit board 10 is not limited to resin. The circuit board 10 is, for example, flat board shaped and is formed to be rectangular plane as viewed from above. A shape of the circuit board 10 is not limited to the rectangular plane as viewed from above. The shape of the circuit board 10 may be another shape, such as square plane as viewed from above.

The connector 20 is mounted on the circuit board 10. When the circuit board 10 is connected to the counterpart connector 100 shown in FIG. 1, the connector 20 electrically connects the circuit board 10 to the counterpart connector 100. More specifically, the electronic apparatus 1 has a plurality of the connectors 20 (e.g., 2 pieces) including a first connector 20a and a second connector 20b. The number of the connectors 20 are two in the description above. However, the number of the connectors 20 is not limited to two. The number of the connectors 20 may be three or more, or may be one.

The first connector 20a and the second connector 20b are arranged in parallel on an end portion of the circuit board 10 on a front side (the negative Y-axis side). More specifically, the first connector 20a is arranged on the end portion of the circuit board 10 on a front left side (the negative X-axis side). The second connector 20b is arranged on the end portion of the circuit board 10 on a front right side (the positive X-axis side).

The term "connector 20" is used below when the first connector 20a and the second connector 20b do not have to be discriminated from each other.

The connector 20 is, for example, a male connector. The connector 20 is formed in a cuboid shape, for example. More specifically, the connector 20 includes an upper portion 21, a lower portion 22, side walls 23a and 23b, a back portion 24, and an opening 25. The upper portion 21, the lower portion 22, the side walls 23a and 23b, the back portion 24, and a protrusion 27, described later, of the connector 20 are made from, for example, resin, but a material thereof is not limited to resin.

The upper portion 21 is arranged on an upper side (the positive Z-axis side) of the connector 20. The upper portion 21 is, for example, flat board shaped and is formed to be rectangular plane as viewed from above, having a longer side expanding in a left-right direction. The lower portion 22 is arranged to face a lower side (the negative Z-axis side) of the upper portion 21. The lower portion 22 is, for example, flat board shaped and is formed to be rectangular plane as viewed from above, having a longer side expanding in the left-right direction.

The side wall 23a is, for example, flat board shaped, and is formed to expand between left end portions of the upper portion 21 and the lower portion 22. The side wall 23b is, for example, flat board shaped, and is formed to expand between right end portions of the upper portion 21 and the lower portion 22. In other words, the side wall 23a and the side wall 23b are arranged so as to face each other.

The back portion 24 is, for example, flat board shaped, and is formed to expand from back end portions (the positive Y-axis side) of the upper portion 21, the lower portion 22, and the side walls 23a and 23b. Thus, an internal space A surrounded by the upper portion 21, the lower portion 22, the side walls 23a and 23b, and the back portion 24 is formed in the connector 20. In other words, the connector 20 is hollow. For example, pins 26 of the connector 20 are provided to the internal space A.

The opening 25 is formed in the connector 20 on a front side, facing the back portion 24. Therefore, the counterpart connector 100 (see FIG. 1) is inserted from the opening 25, and is connected to the connector 20.

The connector 20 configured as described above further includes the protrusion 27. For example, the protrusion 27 is formed on an outer surface 21a of the upper portion 21 of the connector 20 on the front side, i.e., on a side closer to the opening 25, extending upward from the outer surface 21a. The protrusion 27 is formed as one unit with the upper portion 21. However, the protrusion 27 is not limited to this. The protrusion 27 may be a separate part from the upper portion 21.

The protrusion 27 described above, is formed, for example, as a part of the lever mechanism for easy engagement of the connector 20 with the counterpart connector 100 (see FIG. 1), to which the connector 20 is connected.

Here, the connection of the connector 20 with the counterpart connector 100 will be described with reference to FIG. 1. As shown in FIG. 1, the protrusion 27 of the connector 20 is arranged so as to be seen from an outside of the electronic apparatus 1. A configuration in which the protrusion 27 is seen from the outside of the electronic apparatus 1 will be described later.

The counterpart connector 100 is, for example, a female connector. Number of the counterpart connectors 100 are plural (e.g., two), including a first counterpart connector 100a and a second counterpart connector 100b. The first counterpart connector 100a is connectable with the first connector 20a, and the second counterpart connector 100b is connectable with the second connector 20b.

A cable 101 and an engagement lever 102 are arranged to each of the first counterpart connector 100a and the second counterpart connector 100b. The cable 101 connects a vehicle-mounted apparatus that is installed on the vehicle, not illustrated, to the first counterpart connector 100a and the second counterpart connector 100b. The term the counterpart connector 100 is used below when the first counterpart connector 100a and the second counterpart connector 100b do not have to be discriminated from each other.

A power transfer mechanism, such as a link mechanism and a com mechanism, not illustrated, is connected to the engagement lever 102. The engagement lever 102 is engageable to the protrusion 27 via the power transfer mechanism, and the engagement lever 102 stops when being engaged with the protrusion 27. The engagement lever 102 and the power transfer mechanism are part of the lever mechanism.

When the connector 20 is connected to the counterpart connector 100, the engagement lever 102 is operated so as to be engaged with the protrusion 27 of the connector 20 to stop. The counterpart connector 100 is pushed to be engaged with the connector 20 by applying leverage of the protrusion 27 that serves as a pivot point. Thus, a power necessary to engage (connect) the connector 20 with the counterpart connector 100 is reduced and the engagement (connection) of the connector 20 with the counterpart connector 100 is easier. In the foregoing description, the protrusion 27 is formed as the part of the lever mechanism. However, the protrusion 27 is not limited to this. The protrusion 27 may be formed for a purpose of, for example, guiding or fixing the connector 20.

With reference back to FIG. 2, the circuit board 10 having the connector 20 configured as described above is put into the case 30, for example, having an end portion opposite to the front end portion on which the side the connector 20 is arranged, i.e. a back end portion of the connector 20, in the lead. Thus, the circuit board 10 is housed in the case 30.

The case 30 can house the circuit board 10, the connector 20, etc. as described above. For example, the case 30 is formed in a cuboid shape. More specifically, the case 30 includes an upper portion 31, a lower portion 32, side walls 33a and 33b, a back portion 34, and an opening 35. The upper portion 31, the lower portion 32, the side walls 33a and 33b, the back portion 34, and a rib portion 40, described later, are made from, for example, resin. However, a material thereof is not limited to resin.

The upper portion 31 is arranged on an upper side of the entire case 30. The upper portion 31 is, for example, board shaped, having a step in the middle. The upper portion 31 is formed to be rectangular plane as viewed from above. The lower portion 32 is arranged so as to face a lower side of the upper portion 31. Moreover, the lower portion 32 is, for example, flat board shaped and is formed to be rectangular plane as viewed from above.

The side wall 33a is, for example, flat board shaped, and is formed to expand between left end portions of the upper portion 31 and the lower portion 32. The side wall 33b is, for example, flat board shaped, and is formed to expand between right end portions of the upper portion 31 and the lower portion 32. In other words, the side wall 33a and the side wall 33b are arranged so as to face each other.

The back portion 34 is, for example, flat board shaped, and is formed to expand to connect back end portions of the upper portion 31, the lower portion 32, and the side walls 33a and 33b. Thus, an internal space B surrounded by the upper portion 31, the lower portion 32, the side walls 33a and 33b, and the back portion 34 is formed in the case 30. In other words, the case 30 is hollow.

The opening 35 is formed in the case 30 on a front side, facing the back portion 34. Therefore, the circuit board 10 and the connector 20 are inserted from the opening 35 and are housed in the internal space B of the case 30.

Figure 3:
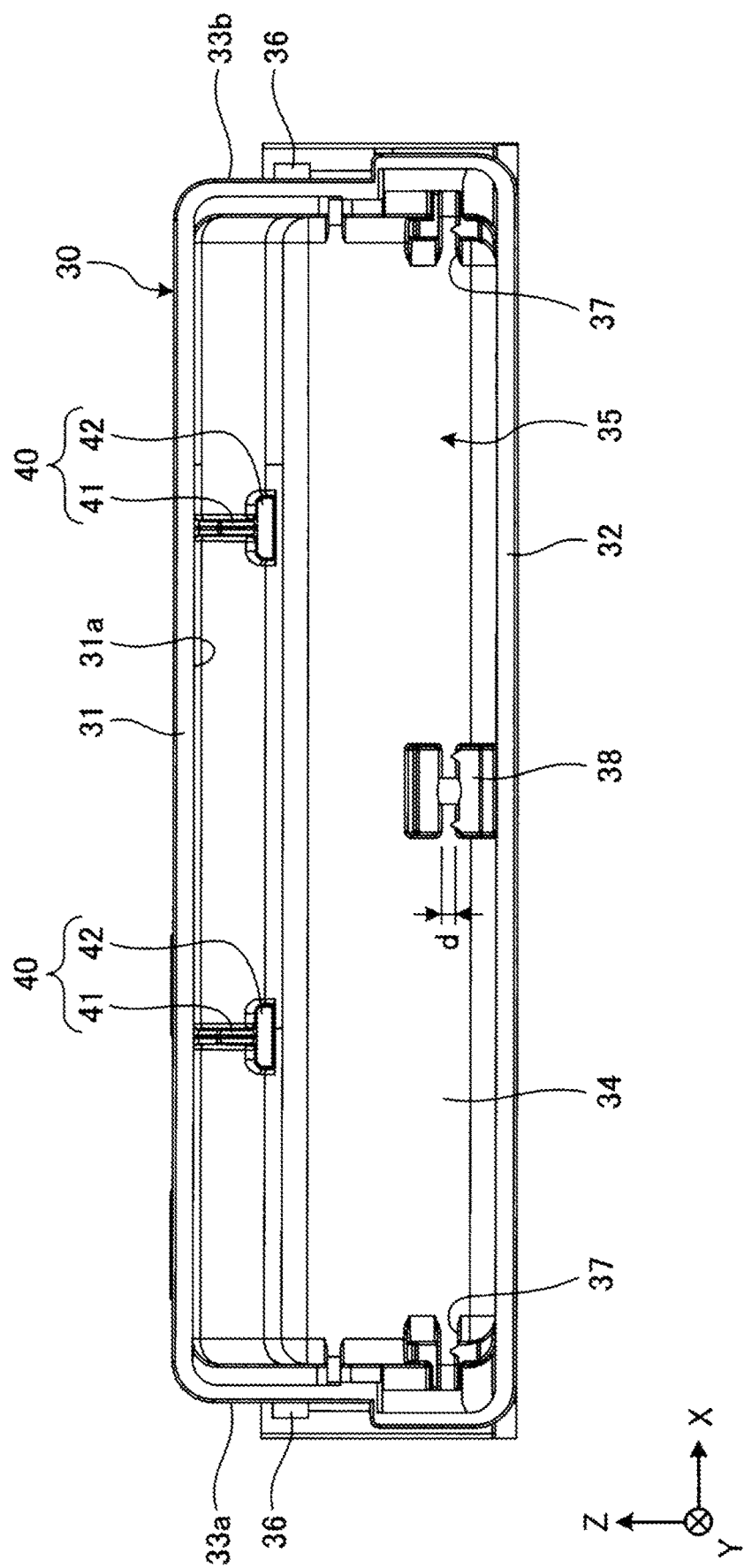
FIG. 3 is a front view of a case.

FIG. 3 is a front view of the case 30 as viewed from a side of the opening 35. As shown in FIGS. 2 and 3, the case 30 further includes an engaging receiving portion 36, a runner 37, a slit 38 (not illustrated in FIG. 2), and a rib portion 40.

The engaging receiving portion 36 is a protrusion to engage with the lid 50. The engaging receiving portion 36 is formed, for example, on an outer surface of each of the side wall 33a and the side wall 33b. The runner 37 guides the circuit board 10 when the circuit board 10 is inserted. For example, the runner 37 is formed on an inner surface of each of the side wall 33a and the side wall 33b. The runner 37 is formed in a groove shape, extending in a front-back direction. Right and left end portions of the circuit board 10 are inserted into the groove shaped portions of the runner 37, and then the circuit board 10 is slid. The runner 37 guides the circuit board 10 inward the case 30.

The slit 38 is configured so as to pinch and hold the housed circuit board 10. For example, as shown in FIG. 3, the slit 38 is located in the case 30 on a back side in an inserting direction of the circuit board 10, i.e., on the back portion 34 of the case 30. The slit 38 is formed in a groove shape, extending in the left-right direction. A slit width d, a width of the groove, is slightly smaller than a thickness of the circuit board 10, not illustrated. Thus, when the circuit board 10 is inserted into the case 30 and reaches the slit 38, a back end portion of the circuit board 10 is pushed into the slit 38 so that the slit 38 pinches and holds the circuit board 10 in a thickness direction.

The rib portion 40 is formed as one unit with a lower surface 31a of the upper portion 31 of the case 30, as shown in FIGS. 2 and 3. In the foregoing description, the rib portion 40 is formed as one unit with the upper portion 31. However, the rib portion 40 is not limited to this. The rib portion 40 may be a separate part from the upper portion 31.

For example, the rib portion 40 includes a pillar 41 and a lower end portion 42. The pillar 41 is formed to extend downward from the lower surface 31a of the upper portion 31 of the case 30. The lower end portion 42 is formed on a lower end of the pillar 41, extending in the front-back direction.

The rib portion 40 including the pillar 41 and the lower end portion 42 is formed in a position on the upper portion 31 of the case 30, corresponding to the protrusion 27 of the connector 20, described above, and gap 57 of the lid 50, described later. In an example shown in FIG. 2 and others, since there are two protrusions 27 and two gaps 57, the two rib portions 40 are arranged in the positions corresponding to the two protrusions 27 and the two gaps 57. However, number of the rib portion 40 is not limited to two. The rib portion 40 is an example of a filler that fills the gap 57 of the lid 50. The lower end portion 42 of the rib portion 40 is arranged to fill the gap 57 of the lid 50. This will be described later.

Figure 4:
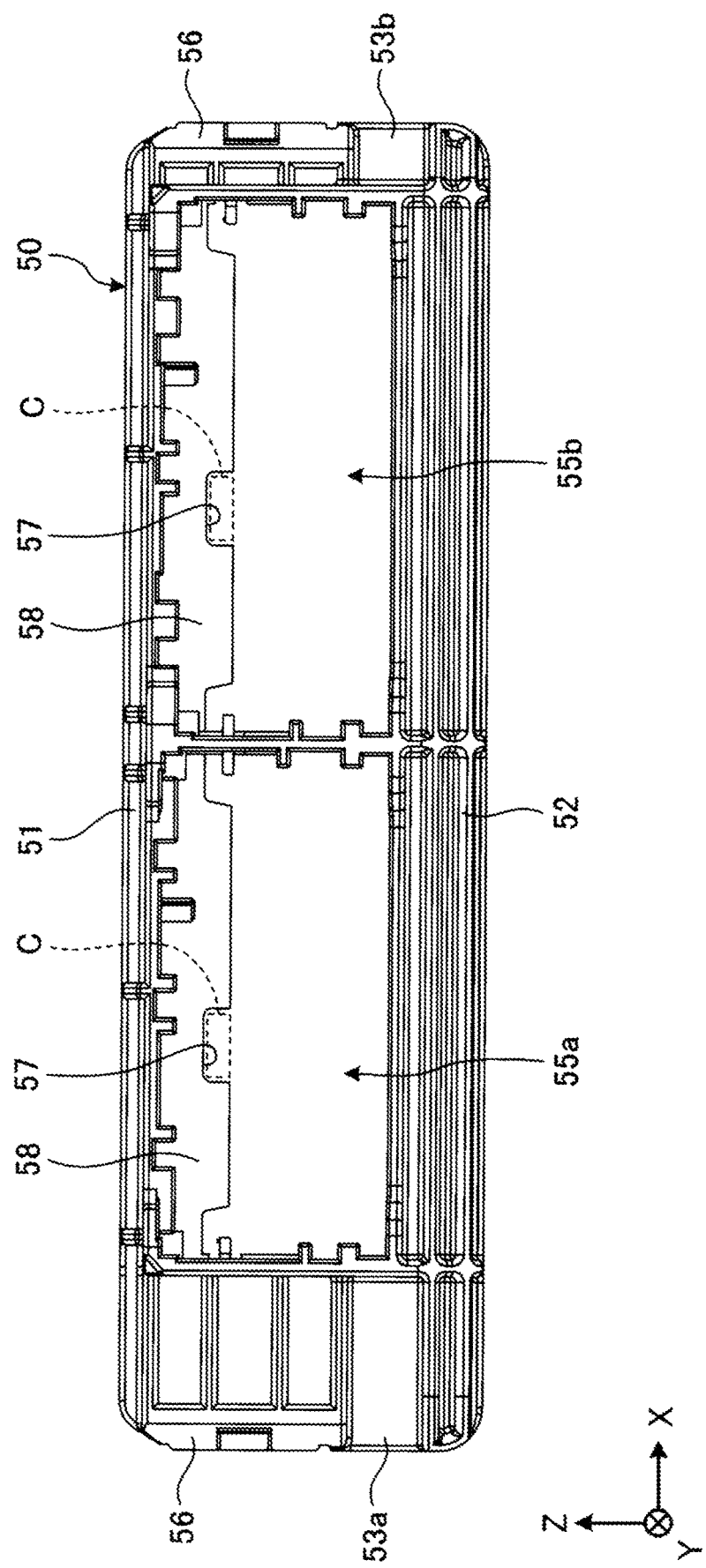
FIG. 4 is a front view of a lid.

Next, the lid 50 will be described with reference to FIGS. 2 and 4. FIG. 4 is a front view of the lid 50. As shown in FIGS. 2 and 4, the lid 50 is formed in a frame shape. The lid 50 is attached to the case 30 (see FIG. 1). The lid 50 is made from resin. However, a material of the lid 50 is not limited to resin.

More specifically, the lid 50 includes an upper portion 51, a lower portion 52, and side walls 53a and 53b. The upper portion 51 is arranged above the connector 20. The lower portion 52 is arranged to face a lower side of the upper portion 51. The side wall 53a is formed to expand between left end portions of the upper portion 51 and the lower portion 52. The side wall 53b is formed to expand between right end portions of the upper portion 51 and the lower portion 52. In other words, the side wall 53a and the side wall 53b are arranged so as to face each other. Openings 55a and 55b are formed in a space surrounded by the upper portion 51, the lower portion 52 and the side walls 53a and 53b. The lid 50 is formed in a frame shape.

The opening 55a corresponds to the first connector 20a described above. The opening 55a is configured such that part of the first connector 20a is seen from an outside of the case 30 when the lid 50 is attached to the case 30. The opening 55b corresponds to the second connector 20b described above. The opening 55b is configured such that part of the second connector 20b is seen from the outside of the case 30 when the lid 50 is attached to the case 30.

The lid 50 further includes an engaging portion 56. For example, the engaging portion 56 includes an engaging opening 56a (see FIG. 2), and is formed on an outer surface of each of the side walls 53a and 53b. When the lid 50 is attached to the case 30, the engaging opening 56a is engaged with the engaging receiving portion 36 of the case 30, and fixes the lid 50 to the case 30.

The lid 50 configured as described above is attached to the case 30 so as to cover the opening 35 of the case 30 housing a circuit board 10 and the connector 20. More specifically, the lid 50 is attached to the opening 35 of the case 30 such that the parts of the connector 20, such as the protrusion 27 and the opening 25, are seen from the outside of the case 30 (see FIG. 1).

Since the protrusion 27 is formed on the connector 20, the gap 57 is formed in the lid 50 to prevent lid 50 from contacting the protrusion 27 when the lid 50 is attached to the opening 35 of the case 30.

For example, the gap 57 is formed in a back wall 58 that extends downward from a back end portion of the upper portion 51 of the lid 50. More specifically, the gap 57 is formed in a position on the back wall 58 corresponding to the protrusion 27 on the connector 20. In other words, the gap 57 is formed in a position that the lid 50 contacts the protrusion 27 when the lid 50 is attached to the case 30 if the gap 57 is not formed. In FIG. 4, the gap 57 is, for example, a rectangular opening as viewed from a front side of the lid 50. The shape of the gap 57 is only an example, and the shape of the gap 57 is not limited to a rectangle.

A space C (see FIG. 4) is formed in the lid 50 by the gap 57, as described above. Thus, when the lid 50 is attached to the case 30, the protrusion 27 passes through the space C of the gap 57. Due to the space C, the lid 50 can avoid contacting the protrusion 27.

As described above, since the gap 57 is formed in the lid 50, a foreign object, such as dust, dirt and metal debris, more easily enter the case 30 from the gap 57. In a case where the foreign object enters the case 30, for example, the foreign object may be attached to the circuit board 10, etc. and may cause a problem of the electronic apparatus 1.

Therefore, the electronic apparatus 1 of the embodiment fills the gap 57 with the rib portion 40 of the case 30 in a state in which the lid 50 is attached to the case 30. This will be explained with reference to FIGS. 5 and 6.

Figure 5:
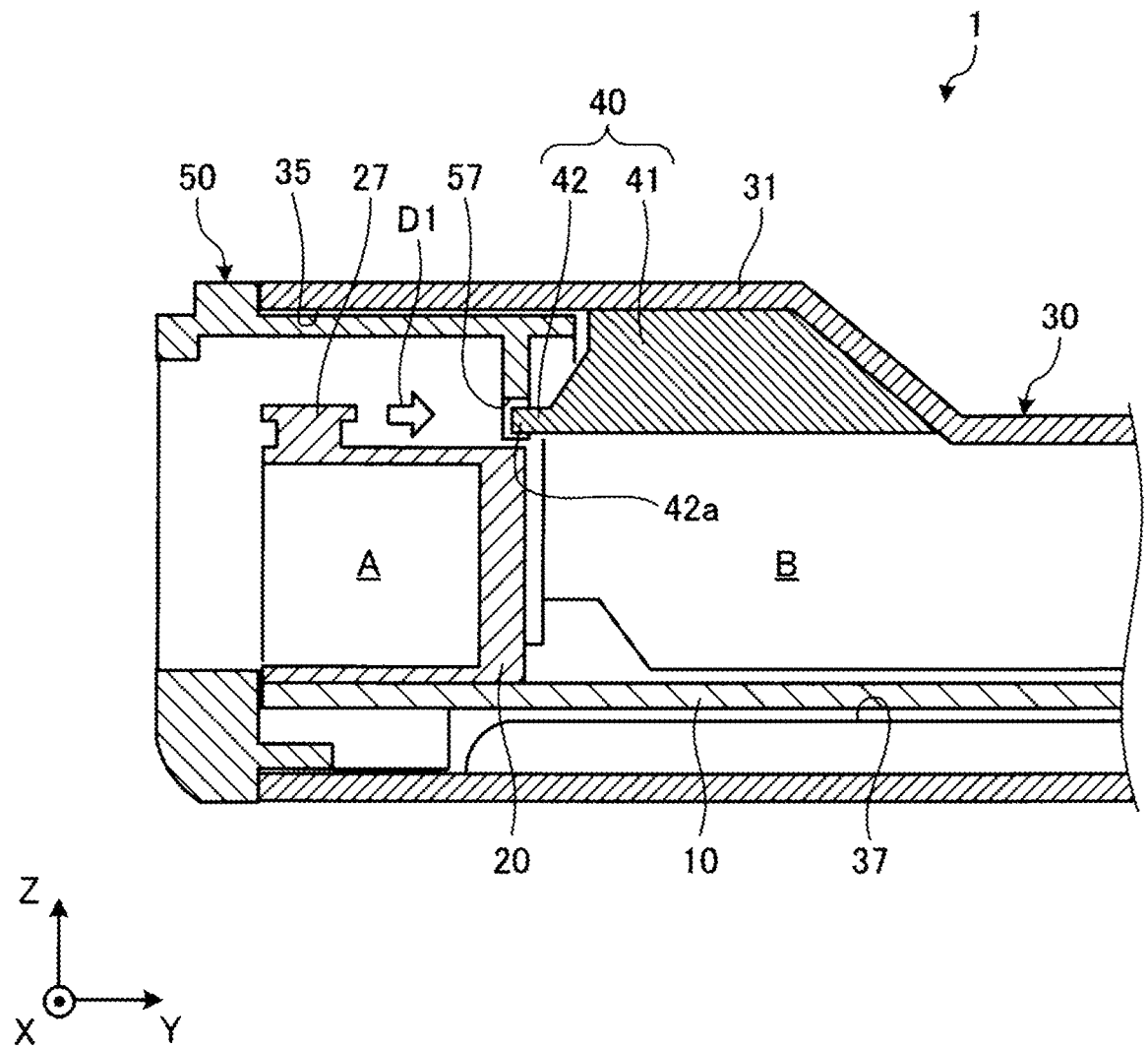
FIG. 5 is a cross-sectional view of an area along the line V-V in FIG. 1.
Figure 6:
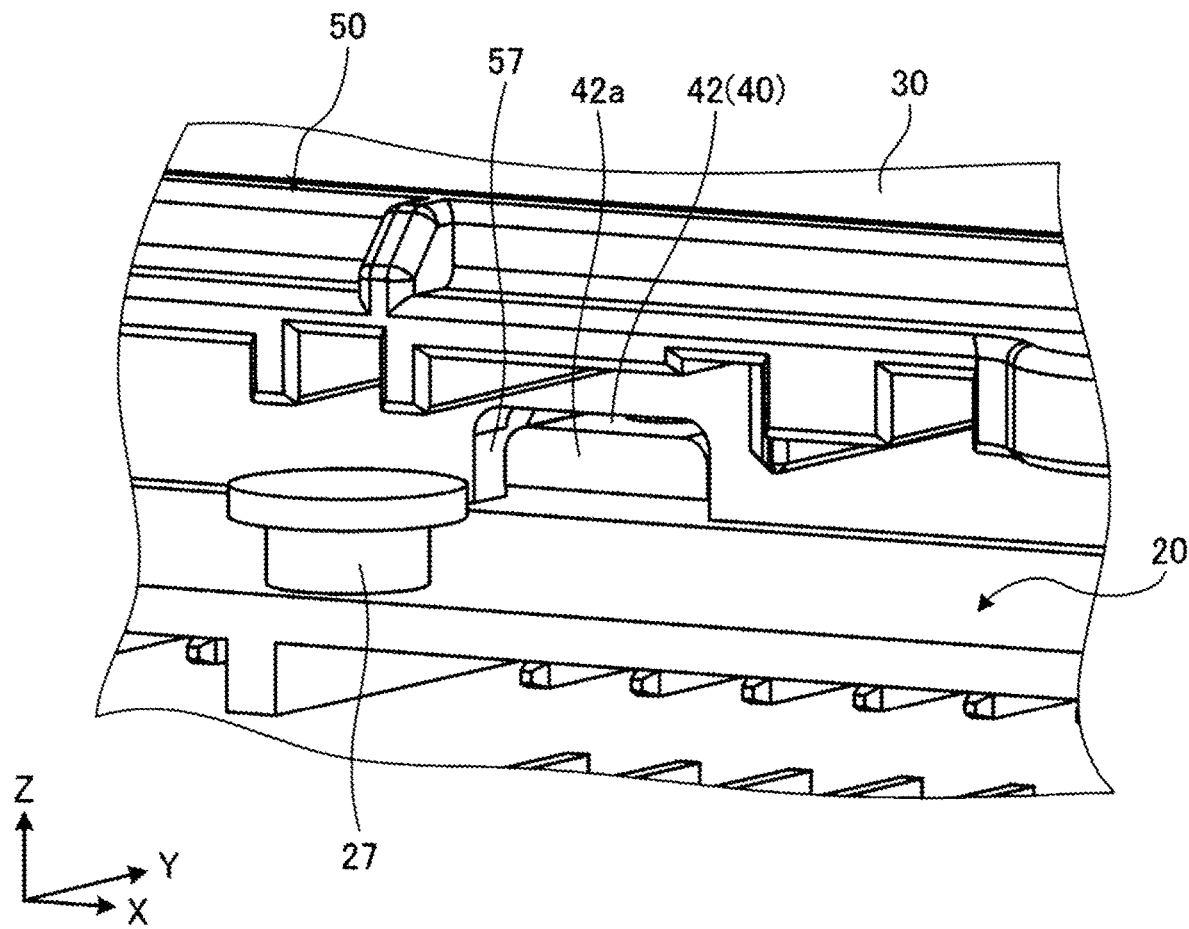
FIG. 6 is an enlarged perspective view of an area near a gap of the lid.

FIG. 5 is an enlarged cross-sectional view of an area near the rib portion 40 and the gap 57 along the line V-V in FIG. 1. FIG. 6 is an enlarged perspective view of the area near the rib portion 40 and the gap 57. In FIG. 5, in order to clarify a position of the rib portion 40, hatching for the rib portion 40 is different from hatching for the upper portion 31 of the case 30.

As shown in FIGS. 5 and 6, the lower end portion 42 of the rib portion 40 is formed such that a front end portion 42a of the lower end portion 42 is located in the gap 57 of the lid 50 in the state in which the lid 50 is attached to the case 30.

In other words, the lower end portion 42 of the rib portion 40 is formed to fill the gap 57 from an opposite side of the gap 57 than the opening 35 of the case 30 (see FIG. 5). In other words, the lower end portion 42 of the rib portion 40 is formed to fill the gap 57, extending frontward from the back side (rearward) of the case 30 toward the opening 35.

Thus, in this embodiment, for example, as shown in an arrow D1 in FIG. 5, it is difficult for a foreign object from the opening 35 of the case 30 to enter an inside of the case 30 from the gap 57. Thus, it is possible to prevent the foreign object from entering the inside of the case 30 from the gap 57. Moreover, in this embodiment, it is also possible, for example, to prevent the foreign object from being attached to the circuit board 10 or the like by preventing the foreign object from entering the case 30.

Moreover, since the rib portion 40 described above is formed to be one unit with the case 30, the gap 57 is filled by a simple configuration including the rib portion 40, without using, for example, another separate part.

As described above, the electronic apparatus 1 of this first embodiment includes the connector 20, the case 30, the lid 50, and the rib portion 40 (an example of a filler). The connector 20 includes the protrusion 27 formed on the outer surface 21a. The case 30 includes the opening 35, and houses the connector 20. The lid 50 is attached to the opening 35 of the case 30 such that at least part of the connector 20 including the protrusion 27 is seen from the outside of the case 30. The gap 57 is formed in the lid 50, and when the lid 50 is attached to the opening 35, the protrusion 27 passes through the gap 57. The rib portion 40 fills the gap 57 in the state in which the lid 50 is attached to the case 30. Thus, it is possible to prevent a foreign object from entering the case 30 from the gap 57 of the lid 50.

Second Embodiment

Next, a configuration of an electronic apparatus 1 of a second embodiment will be described. In the second embodiment, instead of the rib portion 40 of the case 30 in the first embodiment, a wall that is formed on a connector 20 is used to fill a gap 57 of a lid 50.

Figure 7:
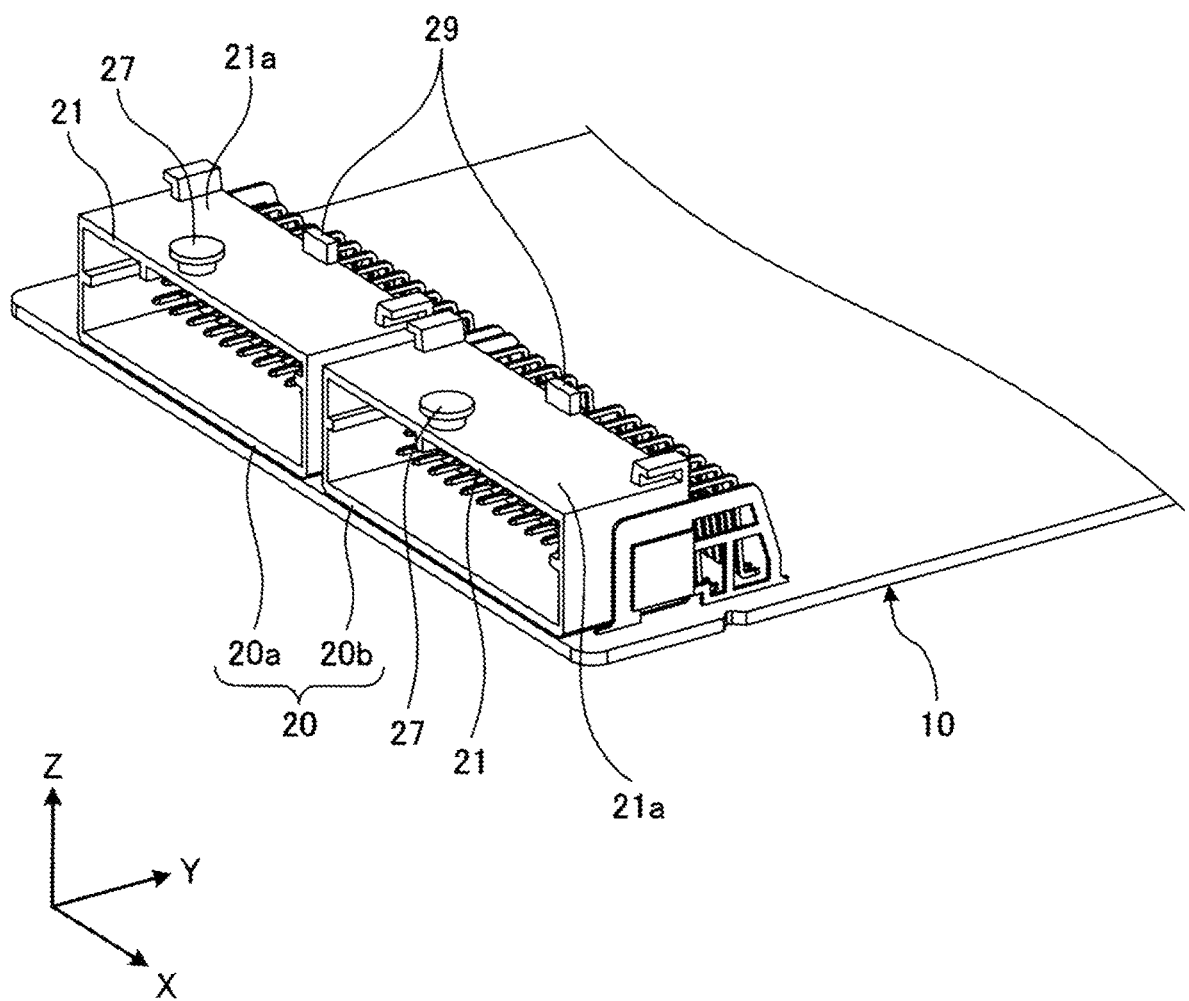
FIG. 7 is a perspective view of a connector in a second embodiment.
Figure 8:
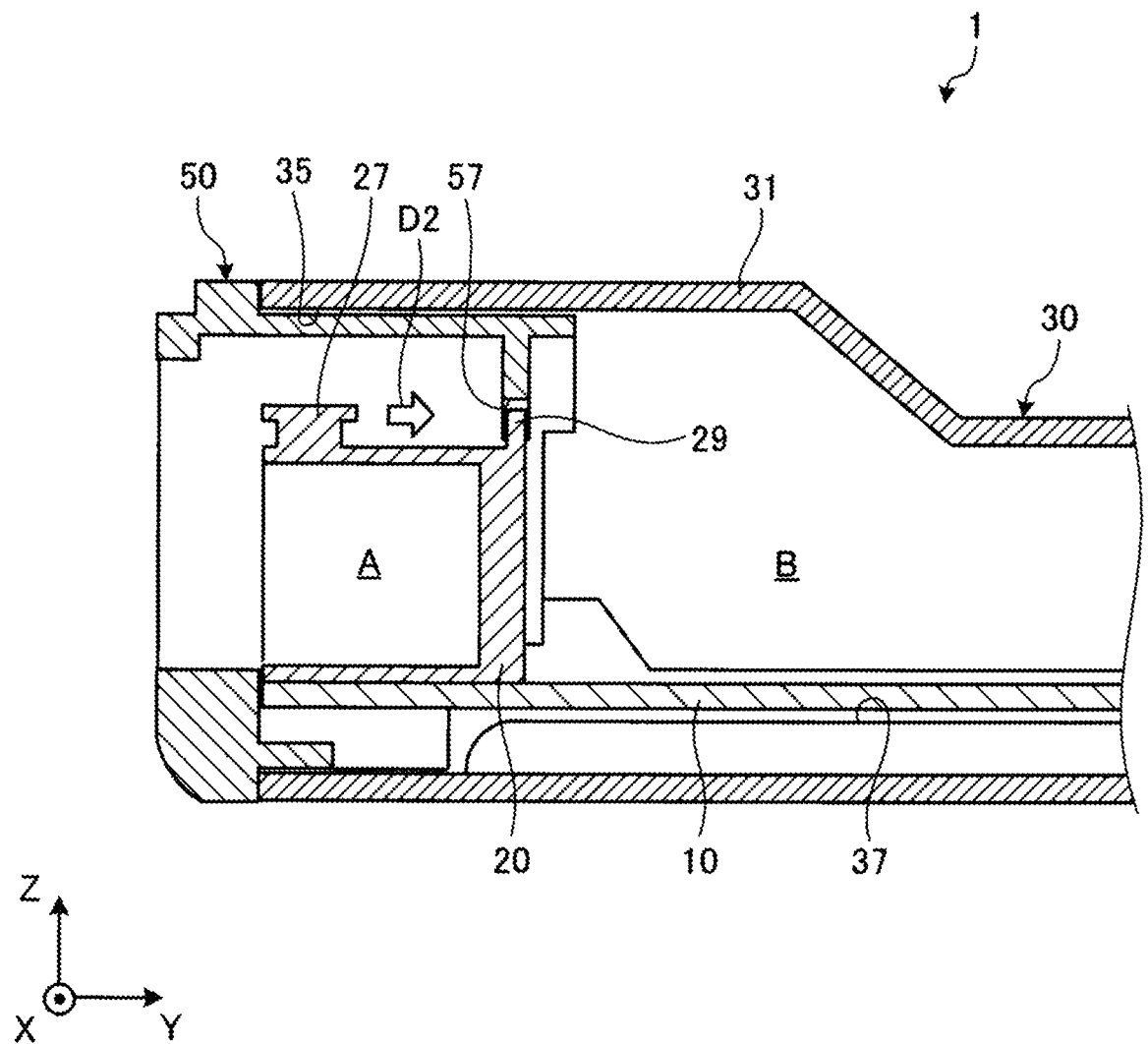
FIG. 8 is an enlarged cross-sectional view of an area near a gap of a lid in the second embodiment.

FIG. 7 is a perspective view of the connector 20 in the second embodiment. FIG. 8 is an enlarged cross-sectional view of an area near the gap 57 of the lid 50. A same numerical reference will be given to a portion/part common to the portion/part in the first embodiment, and explanation of the portion/part will be omitted.

As shown in FIGS. 7 and 8, the connector 20 of the second embodiment includes a wall 29. For example, the wall 29 is formed on a position corresponding to a protrusion 27 on an upper portion 21 of the connector 20 described above and the gap 57 of the lid 50. More specifically, the wall 29 is arranged on an outer surface 21a of the upper portion 21 of the connector 20 on a back side, extending upward from the outer surface 21a. The wall 29 is an example of a filler.

As shown in FIG. 8, the wall 29 is formed so as to be located in the gap 57 of the lid 50 in a state in which the lid 50 is attached to a case 30. In other words, the wall 29 is formed so as to fill the gap 57 of the lid 50.

Thus, in the second embodiment, as shown by an arrow D2 in FIG. 8, it is difficult for a foreign object from the opening 35 of the case 30 to enter the case 30 from the gap 57. Thus, the foreign object is prevented from entering the case 30 from the gap 57. Moreover, in the second embodiment, it is possible to prevent the foreign object from being attached to a circuit board 10 or the like by preventing the foreign object from entering the case 30.

Moreover, since the wall 29 described above is formed to be one unit with the connector 20, the gap 57 is filled by a simple configuration without using, for example, another separate part.

Third Embodiment

Next, a configuration of an electronic apparatus 1 in a third embodiment will be described. The configuration of the electronic apparatus 1 in the third embodiment causes a foreign object that has entered a case 30 to stay in a predetermined area. Thus, it is possible to prevent the foreign object that has entered from being attached to the circuit board 10 and the like. The third embodiment will be described below with reference to FIG. 9.

Figure 9:
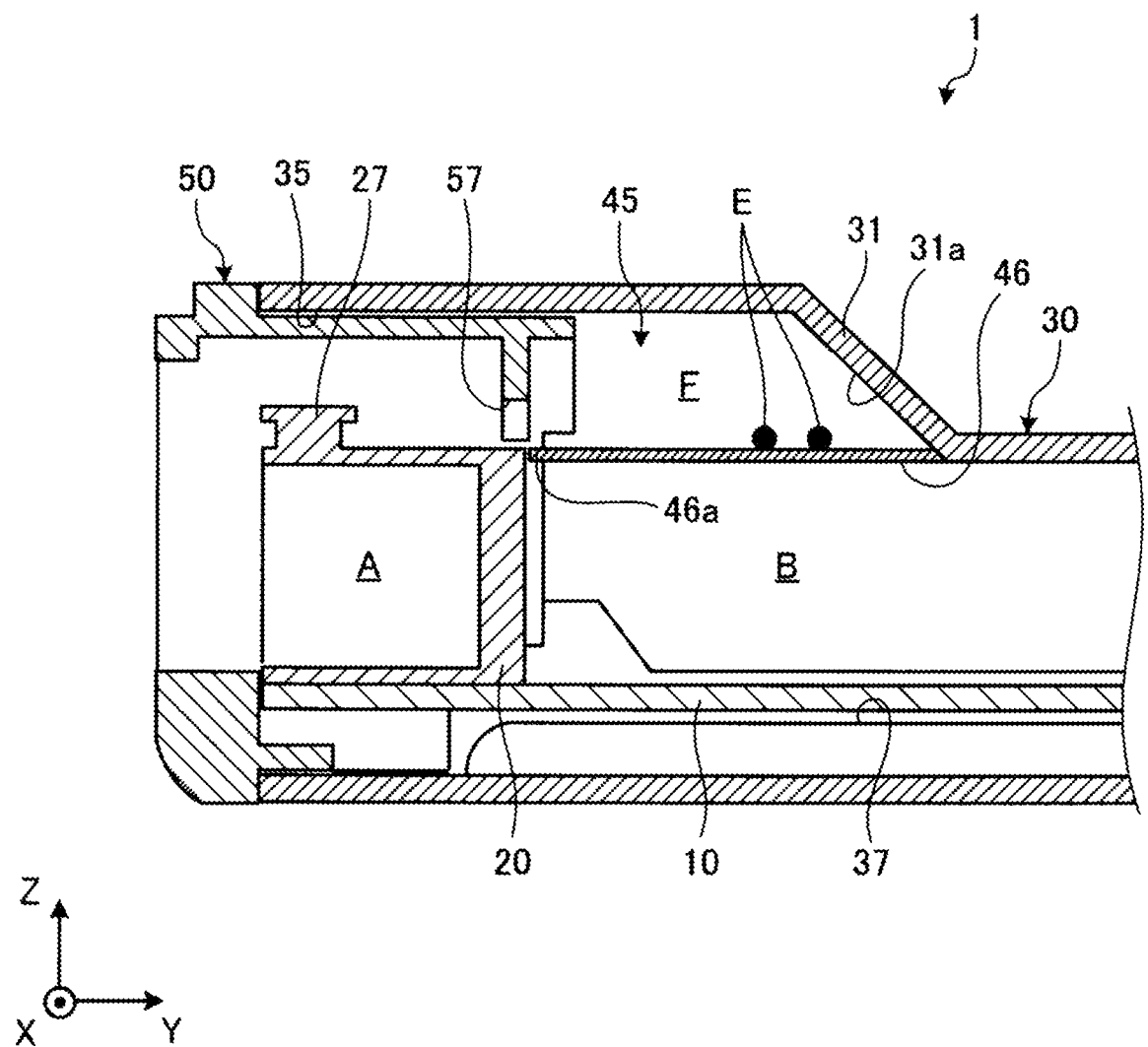
FIG. 9 is an enlarged cross-sectional view of an area near a gap of a lid in a third embodiment.

FIG. 9 is an enlarged cross-sectional view of an area near a gap 57 of a lid 50 in the third embodiment. As shown in FIG. 9, the electronic apparatus 1 in the third embodiment includes a storage 45. For example, the storage 45 is formed on an opposite side of the gap 57 than the opening 35 of the case 30, i.e. is formed on a back side (rear side). The storage 45 is in a shape that can hold a foreign object E that has entered from the gap 57.

For example, the storage 45 includes a bottom portion 46, and is configured by the bottom portion 46 and an upper portion 31 of the case 30. More specifically, the bottom portion 46 is formed to be one unit with the case 30, extending frontward from a lower surface 31a of the upper portion 31 of the case 30. A front end portion 46a of the bottom portion 46 on a front side is formed to be arranged near a lower side of the gap 57 of the lid 50. In FIG. 9, in order to clarify a position of the bottom portion 46, hatching for the bottom portion 46 is different from hatching for the upper portion 31 of the case 30.

Thus, the storage 45 including a space F formed by the bottom portion 46 and the upper portion 31 is arranged behind (on a back side) of the gap 57 of the lid 50. The storage 45 holds, in the space F, the foreign object E that has entered from the gap 57.

Thus, in the third embodiment, it is possible to prevent the foreign object E from entering the case 30 (more specifically, an area in the case 30 in which the circuit board 10 and the like are housed) from the gap 57 of the lid 50 *t*. Therefore, it is possible to prevent, for example, the foreign object E that has entered the case 30 from dropping and attaching onto the circuit board 10 and the like.

Further, since the bottom portion 46 of the storage 45 described above is formed as one unit with the case 30, for example, the storage 45 is provided by a simple configuration without using another separate part. The bottom portion 46 is formed as one unit with the case 30 in the above description. However, the bottom portion 46 is not limited to this. The bottom portion 46 may be a separate part from the case 30.

The foregoing first to third embodiments can be properly combined. In other words, for example, by combining the first and third embodiments, the electronic apparatus 1 may be configured such that the rib portion 40 fills the gap 57 of the lid 50 and that the storage 45 is arranged behind the gap 57. Further, for example, by combining the second and third embodiments, the electronic apparatus 1 may be configured such that the wall 29 fills the gap 57 of the lid 50 and that the storage 45 is arranged behind the gap 57.

Further effects and modifications can be easily derived by a person skilled in the art. Therefore, a broader mode of the invention is not limited to the specific description and the typical embodiments described above. Thus, various modifications are possible without departing from the comprehensive concept or the scope of the present invention defined by the attached claims and equivalents thereof.

While the invention has been shown and described in detail, the foregoing description is in all aspects illustrative and not restrictive. It is therefore understood that numerous other modifications and variations can be devised without departing from the scope of the invention.

What is claimed is:

1. An electronic apparatus, comprising:
   a connector that has a protrusion on an outer surface;
   a case that has top, bottom and side walls that extend in a longitudinal direction of the case, the case further having an opening at a front side of the case, the case housing the connector within the case;
   a lid for the opening that is attached to the front side of the case such that at least part of the connector including the protrusion is seen from an outside of the case, the lid including a back wall that extends in a direction that crosses the longitudinal direction of the case, the back wall of the lid further including a gap through which the protrusion of the connector passes when the lid is attached to the case, the back wall being arranged on the lid so that after the lid is attached to the front side of the case, the protrusion is not located within the gap; and
   a filler that at least partially is disposed within the gap of the lid to fill the gap of the lid in a state in which the lid is attached to the case.

2. The electronic apparatus according to claim 1, wherein the filler is arranged on the case and includes a rib portion that is arranged to fill the gap of the lid from an opposite side of the gap than the opening of the case.

3. The electronic apparatus according to claim 1, wherein the filler includes a wall that is arranged in a position on the connector corresponding to the gap of the lid.

4. The electronic apparatus according to claim 1, further comprising:
   a storage that is formed in the case rearward of the back wall of the lid and adjacent to a position of the gap in the state in which the lid is attached to the case, the storage being configured to hold a foreign object that has entered from the case through the gap.

5. An electronic apparatus, comprising:
   a connector that has a protrusion on an outer surface;
   a case that has top, bottom and side walls that extend in a longitudinal direction of the case, the case further having an opening at a front side of the case, the case housing the connector within the case;
   a lid for the opening that is attached to the front side of the case such that at least part of the connector including the protrusion is seen from an outside of the case, the lid including a back wall that extends in a direction that crosses the longitudinal direction of the case, the back wall of the lid further including a gap through which the protrusion of the connector passes when the lid is attached to the case, the back wall being arranged on the lid so that after the lid is attached to the front side of the case, the protrusion is not located within the gap; and
   a storage that is formed in the case rearward of the back wall of the lid and adjacent to a position of the gap in the state in which the lid is attached to the case, the storage being configured to hold a foreign object that has entered the case through the gap of the lid.

6. The electronic apparatus according to claim 1, wherein the protrusion of the connector is configured to engage with a counterpart connector to which the connector is to be coupled.

7. The electronic apparatus according to claim 1, wherein an entirety of the back wall is located rearward of the protrusion of the connector relative to the front side of the case in the state in which the lid is attached to the case.

* * * * *